(12) United States Patent
Park et al.

(10) Patent No.: US 8,125,143 B2
(45) Date of Patent: Feb. 28, 2012

(54) ORGANIC LIGHT EMITTING DIODE DISPLAY

(75) Inventors: Soon-Ryong Park, Yongin (KR); Woo-Suk Jung, Yongin (KR); Hee-Seong Jeong, Yongin (KR); Eun-Ah Kim, Yongin (KR); Hee-Chul Jeon, Yongin (KR); Chul-Woo Jeong, Yongin (KR); Noh-Min Kwak, Yongin (KR); Joo-Hwa Lee, Yongin (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 277 days.

(21) Appl. No.: 12/654,838

(22) Filed: Jan. 6, 2010

(65) Prior Publication Data

US 2010/0182552 A1    Jul. 22, 2010

(30) Foreign Application Priority Data

Jan. 21, 2009  (KR) .......................... 10-2009-0005168

(51) Int. Cl.
  *H01J 1/62*    (2006.01)
  *H01J 63/04*   (2006.01)

(52) U.S. Cl. ........................................ 313/505; 313/504
(58) Field of Classification Search ........... 313/504–505
  See application file for complete search history.

(56) References Cited

U.S. PATENT DOCUMENTS 8,058,783 B2 * 11/2011 Park et al. ..................... 313/110
2010/0148192 A1 * 6/2010 Jung et al. ....................... 257/88

FOREIGN PATENT DOCUMENTS

| JP | 2002-033198 | | 1/2002 |
| JP | 2002-215067 | | 7/2002 |
| JP | 2004-086145 | A | 3/2004 |
| JP | 2007-095518 | | 4/2007 |
| JP | 2007-109645 | | 4/2007 |
| KR | 10 2006-0065729 | A | 6/2006 |

\* cited by examiner

*Primary Examiner* — Phu Vu
(74) *Attorney, Agent, or Firm* — Lee & Morse, P.C.

(57) ABSTRACT

An OLED display includes a pixel electrode on a substrate, an organic emission layer on the pixel electrode, a first common electrode on the organic emission layer, a transmission layer on the first common electrode, a second common electrode on the transmission layer, a selective reflective layer on the second common electrode, a polarizing plate on the selective reflective layer, and a phase delay plate between the polarizing plate and the second common electrode.

20 Claims, 7 Drawing Sheets

ORGANIC LIGHT EMITTING DIODE DISPLAY

BACKGROUND

1. Field

Embodiments relate to an organic light emitting diode (OLED) display. More particularly, embodiments relate to an OLED display that improves visibility by efficiently suppressing reflection of external light.

2. Description of the Related Art

An OLED display includes a plurality of OLEDs including hole injection electrodes, an organic light emission layer, and electron injection electrodes. Light is emitted by energy generated when excitons generated as electrons and holes are combined and transition from an excited state to a ground state. The OLED display displays an image using the emitted light.

Accordingly, the OLED display has self-luminance characteristics and, unlike a liquid crystal display (LCD), the thickness and weight thereof may be reduced, since a separate light source is not required. Further, because the OLED display has high quality characteristics, e.g., low power consumption, high luminance, and fast response time, the OLED display is appropriate for use in a mobile electronic device.

In general, electrodes and metal wires of the OLED display reflect external light. Due to reflection of the external light, expression of black and contrast may be deteriorated, thereby deteriorating display characteristics of the OLED display.

The above information disclosed in this Background section is only for enhancement of understanding of the background of the invention and therefore it may contain information that does not form the prior art that is already known in this country to a person of ordinary skill in the art.

SUMMARY

Embodiments are therefore directed to an organic light emitting diode (OLED) display, which substantially overcome one or more of the problems due to the limitations and disadvantages of the related art.

It is therefore a feature of an embodiment to provide an OLED display that reduces reflection of external light.

It is therefore another feature of an embodiment to provide an OLED display having improved visibility thereof.

It is therefore another feature of an embodiment to provide an OLED display that minimizes loss of light to be displayed.

At least one of the above and other features and advantages may be realized by providing an OLED display including a pixel electrode on a substrate, an organic emission layer on the pixel electrode, a first common electrode on the organic emission layer, a transmission layer on the first common electrode, a second common electrode on the transmission layer, a selective reflective layer formed on the second common electrode, a polarizing plate on the selective reflective layer, and a phase delay plate disposed between the polarizing plate and the second common electrode.

The selective reflective layer may be a cholesteric liquid crystal (CLC) layer, and the phase delay plate may be disposed between the polarizing plate and the CLC layer. The CLC layer may transmit one of left circularly polarized light and right circularly polarized light, and reflect the other.

Light that is linearly polarized while passing through the polarizing plate may be circularly polarized after passing through the phase delay plate.

The phase delay plate is a ¼ wavelength plate, and an angle of intersection between a light axis of the phase delay plate and a polarizing axis of the polarizing plate may be 45 degrees.

The selective reflective layer may be a dual brightness enhancement film (DBEF), and the phase delay plate may be disposed between an OLED and the DBEF.

The polarizing plate and the DBEF may have the same polarizing axis.

Light that is linearly polarized while passing through the DBEF may be circularly polarized while passing through the phase delay plate.

The phase delay plate is a ¼ wavelength plate, and an angle of intersection between a light axis of the phase delay plate and a polarizing axis of the polarizing plate may be 45 degrees.

One of the first common electrode and the second common electrode may be formed as a transflective layer.

The transflective layer may be made of a metal of at least one of magnesium (Mg), silver (Ag), calcium (Ca), lithium (Li), chromium (Cr), and aluminum (Al).

The OLED display may further include a pixel defining layer having an opening that exposes the pixel electrode and is formed on the substrate member. The pixel defining layer may have a black or grey-based color. The pixel defining layer may be disposed under the first common electrode.

The phase delay plate may be between the polarizing plate and the selective reflective layer, or the phase delay plate may be between the second common electrode and the selective reflective layer.

The transmission layer may be directly on the first common electrode and the second common electrode may be directly on the transmission layer.

At least one of the above and other features and advantages may be realized by providing an optical member for use with an organic light emitting diode (OLED) display including a pixel electrode on a substrate, an organic emission layer on the pixel electrode, a first common electrode on the organic emission layer, a transmission layer on the first common electrode, a second common electrode on the transmission layer, the optical member including a selective reflective layer to be positioned adjacent the second common electrode, a polarizing plate on the selective reflective layer, and a phase delay plate between the polarizing plate and the second common electrode.

The OLED display may include a sealing member. The optical member may be on the sealing member or between the sealing member and the second common electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
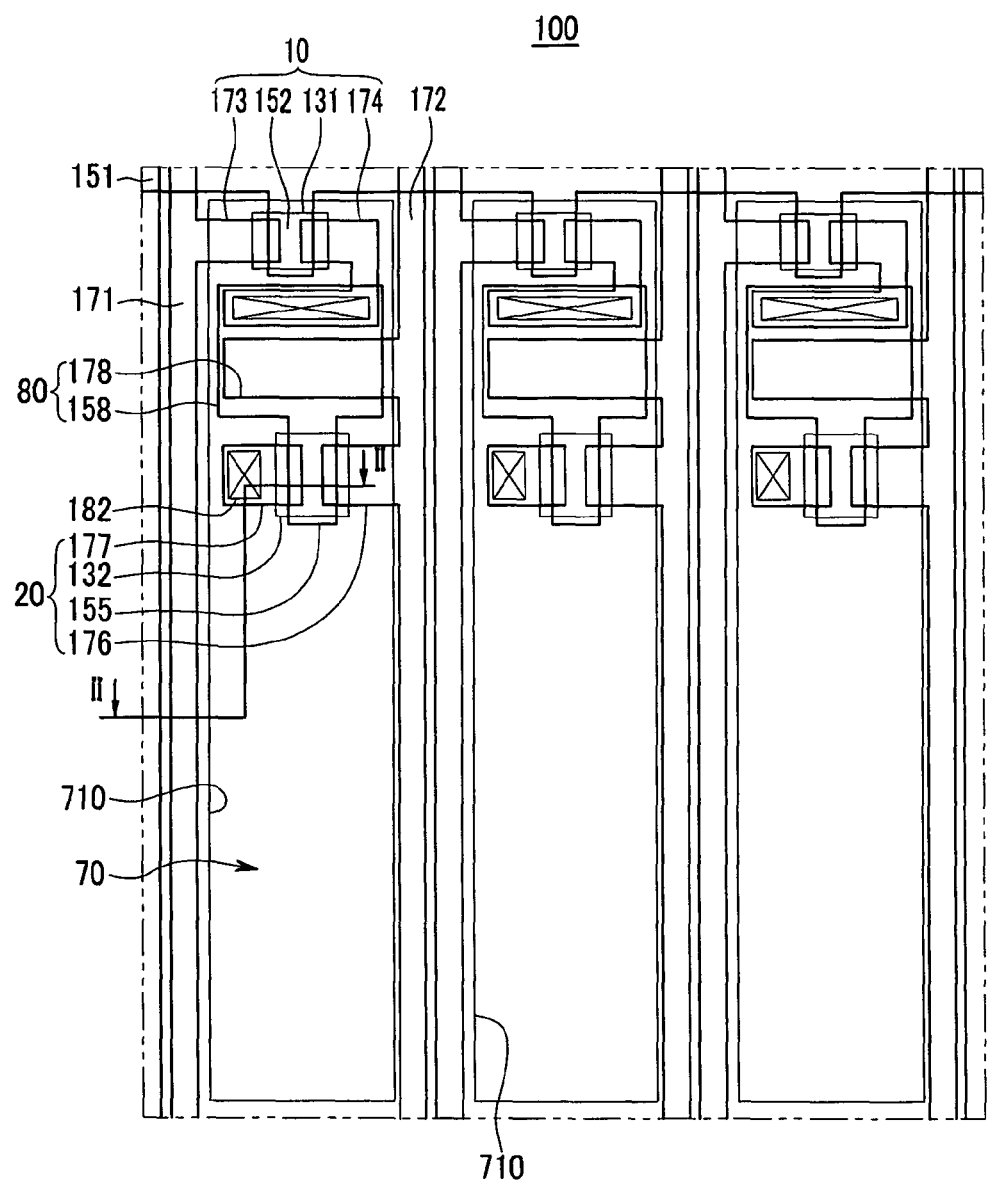
FIG. 1 illustrates a layout view of an OLED display according to a first exemplary embodiment.

Korean Patent Application No. 10-2009-0005168, filed on Jan. 21, 2009, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the several exemplary embodiments, constituent elements having the same configuration are representatively described in a first exemplary embodiment by designating like constituent elements thereto, and other exemplary embodiments will be described only regarding differences from the first exemplary embodiment.

In addition, in the accompanying drawings, an organic light emitting diode (OLED) display is illustrated as an active matrix (AM)-type OLED display having a 2Tr-1Cap structure in which one pixel includes two thin film transistors (TFTs) and one capacitor, but the present invention is not limited thereto. Therefore, the OLED display may have various structures. For example, three or more TFTs and two or more capacitors may be provided in one pixel of the OLED display, and separate wires can be further provided in the OLED display. Here, a pixel refers to a minimum unit for displaying an image, and the OLED display displays an image using a plurality of pixels.

Hereinafter, a first exemplary embodiment will be described with reference to FIG. 1 and FIG. 2.

Figure 2:
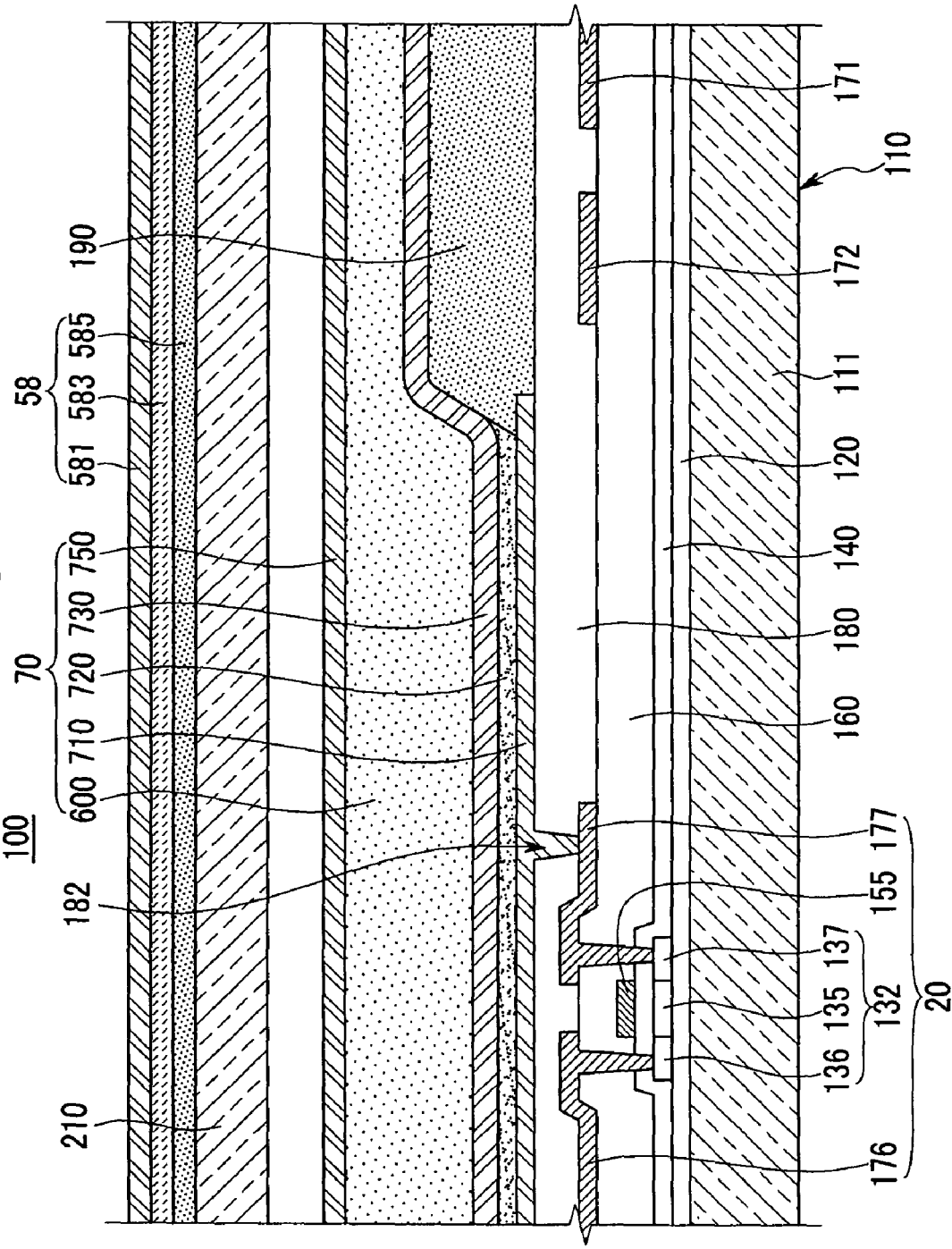
FIG. 2 illustrates a cross-sectional view of FIG. 1 taken along the line II-II.

As shown in FIG. 1 and FIG. 2, an organic light emitting diode (OLED) display 100 may include a switching thin film transistor 10, a driving thin film transistor 20, a capacitor 80, and an OLED 70 in one pixel. In addition, the OLED display 100 may include gate lines 151 aligned along one direction, and data lines 171 and common power lines 172 that respectively cross the gate lines 151 and are insulated therefrom. Here, one pixel may be defined by a boundary of a gate line 151, a data line 171, and a common power line 172. However, definition of the pixel is not limited thereto.

The OLED 70 may include a pixel electrode 710, an organic emission layer 720 formed on the pixel electrode 710, and a common electrode 730 formed on the organic emission layer 720. Here, the pixel electrode 710 may be a positive (+) electrode, i.e., a hole injection electrode, and the common electrode 730 is a negative (−) electrode, i.e., an electron injection electrode. However, embodiments are not limited thereto. For example, the pixel electrode 710 may be the negative electrode and the common electrode 730 may be the positive electrode according to a driving method of the OLED display 100. Holes and electrons may be respectively injected from the pixel electrode 710 and the common electrode 730 into the organic emission layer 720, and form excitons. When the excitons transition from an excited state to a base state, light is emitted.

The capacitor 80 may include a first capacitive plate 158 and a second capacitive plate 178 with a gate insulating layer 140 interposed therebetween.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177.

The switching thin film transistor 10 may be used as a switch for selecting a pixel to emit light. The switching gate electrode 152 may be connected to the gate line 151. The switching source electrode 173 may be connected to the data line 171. The switching drain electrode 174 may be disposed at a distance from the switching source electrode 173 and may be connected to the first capacitive plate 158.

The driving thin film transistor 20 may apply driving power to the pixel electrode 710 for light emission from the organic emission layer 720 of the OLED 70 in the selected pixel. The driving gate electrode 155 may be connected to the first capacitive plate 158. The driving source electrode 176 and the second capacitive plate 178 may be respectively connected to the common power line 172. The driving drain electrode 177 may be connected to the pixel electrode 710 of the OLED 70 through a contact hole 182.

With the above-described structure, the switching thin film transistor 10 may be driven to transmit a data voltage applied to the data line 171 to the driving thin film transistor 20 by a gate voltage applied to the gate line 151. A voltage that corresponds to a voltage difference between a common voltage transmitted from the common power line 172 to the driving thin film transistor 20 and the data voltage transmitted from the switching thin film transistor 10 may be stored in the capacitor 80. A current corresponding to the voltage stored in the capacitor 80 may flow to the OLED 70 through the driving thin film transistor 20 so that the OLED 70 emits light.

In addition, the OLED display 100 may include a pixel defining layer 190, a sealing member 210, and an optical member 58.

The pixel defining layer 190 may have an opening that exposes the pixel electrode 710, and the pixel electrode 710 may be formed at a position that corresponds to the opening of the pixel defining layer 190. In addition, the pixel defining layer 190 may be black or a grey-based color. Thus, the pixel defining layer 190 may suppress reflection of external light by absorbing light. The pixel defining layer 190 has the black or grey-based color in the first exemplary embodiment, but it is not limited thereto. That is, the pixel defining layer 190 may not be colored.

The sealing member 210 may be sealed with a substrate member 111 by being attached thereto with the OLED 70 therebetween. The sealing member 210 may cover the thin film transistors 10 and 20 and the OLED 70 formed on the substrate member 111 from the external environment to protect these elements. Here, a configuration, excluding the sealing member 210 and the optical member 58, forms a display plate 110. An insulation substrate made of a material such as glass or plastic may be used as the sealing member 210.

The optical member 58 may minimize loss of externally emitted light from the OLED 70 while improving visibility of the OLED display 100 by suppressing reflection of external light. The optical member 58 may include a selective reflective layer 585 formed on the OLED 70, a phase delay plate 583 formed on the selective reflective layer 585, and a polarizing plate 581 formed on the phase delay plate 583. In addition, according to the first exemplary embodiment illustrated in FIG. 2, the optical member 58 may be formed on the sealing member 210, but placement of the optical member 58 is not limited thereto. For example, the optical member 58 may be between the sealing member 210 and the OLED 70.

The polarizing plate 581 may linearly polarize light with respect to a polarization axis thereof In further detail, the polarizing plate 581 may transmit light aligned with the polarization axis and may absorb all other light. Accordingly, light having passed through the polarizing plate 581 is linearly polarized toward the polarization axis.

The phase delay plate 583 may be a ¼ wavelength plate having an optic axis that is rotated by 45 degrees from the polarization axis of the polarizing plate 581. That is, an angle of intersection between the optic axis of the phase delay plate 583 and the polarization axis of the polarizing plate 581 is about 45 degrees. Accordingly, light that is linearly polarized by passing through the polarizing plate 581 is circularly polarized after passing through the phase delay plate 583. As the angle of intersection between the optic axis of the phase delay plate 583 and the polarizing axis of the polarizing plate 581 is close to 45 degrees, linearly polarized light becomes substantially circularly polarized light after passing through the phase delay plate 583.

A cholesteric liquid crystal (CLC) may be used as the selective reflective layer 585. Hereinafter, the selective reflective layer 585 is referred to as a CLC layer in the first exemplary embodiment.

CLC has a layered structure like a smectic liquid crystal, but molecules of a longitudinal axis are arranged in parallel like a nematic liquid crystal. In further detail, thin and long molecules are arranged in parallel in a longitudinal direction in one plane and move to a direction that is perpendicular to the corresponding surface, so that the alignment direction of the molecular axis is curved in a helical shape. Therefore, the entire liquid crystal layer has a helical structure. Accordingly, the CLC has unique optical characteristics, including optical rotary power, selective light scattering, circular polarization, and circular dichroism.

Therefore, the CLC layer 583 may selectively transmit or reflect circularly polarized light. The CLC layer 583 according to the exemplary embodiment transmits right circularly polarized light and reflects left circularly polarized light.

The OLED 70 of the OLED display 100 may further include a transmittance layer 600 formed on the common electrode 730 and an additional common electrode 750 formed on the transmittance layer 600. Hereinafter, the common electrode 730 is referred to as a first common electrode and the additional common electrode 750 is referred to as a second common electrode. Here, the first common electrode 730 may be formed on the organic emission layer 720 and the pixel defining layer 190.

The first common electrode 730 and the second common electrode 750 may be formed as a transflective layer. However, embodiments are not limited thereto. That is, only one of the first common electrode 730 and the second common electrode 750 may be transflective, and the other one may be transparent.

Both sides of the transmission layer 600 may be respectively attached to the first common electrode 730 and the second common electrode 750, i.e., the transmission layer 600 may be directly on the first common electrode 730 and the second common electrode 750 may be directly on the transmission layer 600. That is, an interface with air may not exist between the transmission layer 600 and the first common electrode 730 or between the transmission layer 600 and the second common electrode 750, i.e., the transmission layer 600 may be directly on the first common electrode 730 and the second common electrode 750 may be directly on the transmission layer 600. Accordingly, most of the external light is extinguished by destructive interference due to reflection between the first common electrode 730 and the second common electrode 750. For effective destructive interference of light between the first common electrode 730 and the second common electrode 750, the transmission layer 600 should have an appropriate refractive index and thickness. The refractive index and thickness of the transmission layer 600 will be described in further detail later with reference to Equation 1.

As described, the OLED display 100 may suppress reflection of external light using the optical member 58, the first common electrode 730, the transmission layer 600, the second common electrode 750, and the pixel defining layer 190, thereby improving visibility.

Hereinafter, a structure of the OLED display 100 according to the first exemplary embodiment will be described in further detail with reference to FIG. 2. FIG. 2 illustrates the OLED display 100, focusing on the driving thin film transistor 20, the OLED 70, and the capacitor 80.

Hereinafter, a structure of a thin film transistor will be described in further detail with reference to the driving thin film transistor 20. The switching thin film transistor 10 will be discussed only with respect to differences from the driving thin film transistor 20.

The substrate member 111 may be an insulating substrate, e.g., glass, quartz, ceramic, plastic, etc. However, embodiments are not limited thereto. Thus, the substrate member 111 may be formed of a metal substrate, e.g., stainless steel.

A buffer layer 120 may be formed on the substrate member 111. The buffer layer 120 may prevent impurities from permeating and planarize a surface thereof The buffer layer 120 may be made of various materials for performing such a function. For example, a silicon nitride (SiNx) layer, a silicon dioxide (SiO2) layer, and a silicon oxynitride (SiOxNy) layer may be used as the buffer layer 120. However, the buffer layer 120 may be omitted according to types and process conditions of the substrate member 111.

A driving semiconductor layer 132 may be formed on the buffer layer 120. The driving semiconductor layer 132 may be, e.g., a polysilicon layer. In addition, the driving semiconductor layer 132 may include a channel region 135 in which impurities are not doped, and a source region 136 and a drain region 137 that are doped with impurities at respective sides of the channel region 135. For example, a doped ion material may be a P-type impurity, e.g., a material including boron (B) such as $B_2H_6$. The impurity may change in accordance with the type of thin film transistor.

In the first exemplary embodiment, a PMOS-structured thin film transistor using the P-type impurity may be used as the driving thin film transistor 20, but embodiments are not limited thereto. For example, an NMOS-structured thin film transistor or a CMOS-structured thin film transistor may be used as the driving thin film transistor 20.

In addition, although the driving thin film transistor 20 of FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

The gate insulation layer 140 may be made of silicon nitride ($SiN_x$) or silicon dioxide ($SiO_2$) and may be formed on the driving semiconductor layer 132. A gate wire including the driving gate electrode 155 may be formed on the gate insulating layer 140. The gate wire may further include the gate line 151 (shown in FIG. 1), the first capacitive plate 158 (shown in FIG. 1), and other wires. In addition, the driving gate electrode 155 may overlap at least a part of the driving semiconductor layer 132 and, particularly, may overlap the channel region 135.

An interlayer insulation layer 160 that covers the driving gate electrode 155 may be formed on the gate insulating layer 140. The gate insulating layer 140 and the interlayer insulating layer 160 may share through-holes exposing the source region 136 and the drain region 137 of the driving semiconductor layer 132. Like the gate insulating layer 140, the interlayer insulating layer 160 may include silicon nitride ($SiN_x$) or silicon dioxide ($SiO_2$).

A data wire including the driving source electrode 176 and the driving drain electrode 177 may be formed on the interlayer insulating layer 160. The data wire may further include the data line 171, the common power line 172, the second capacitive plate 178 (shown in FIG. 1), and other wires. In addition, the driving source electrode 176 and the driving drain electrode 177 may be respectively connected to the source region 136 and the drain region 137 of the driving semiconductor layer 132 through the through-holes.

As described, the driving thin film transistor 20 may include the driving semiconductor layer 132, the driving gate electrode 155, the driving source electrode 176, and the driving drain electrode 177. A configuration of the driving thin film transistor 20 is not limited to the above-described embodiment, and may be variously modified as may be realized by a person of ordinary skill in the art.

A planarization layer 180 that covers the data wires 171, 172, 176, and 177 may be formed on the interlayer insulating layer 160. The planarization layer 180 may cover the wires or other discontinuities to planarize the interlayer insulating layer 160 in order to increase luminous efficiency of the OLED 70. In addition, the planarization layer 180 may have a contact hole 182 through which the drain electrode 177 may be partially exposed. The planarization layer 180 may be made of at least one of polyacrylate resin, epoxy resin, phenolic resin, polyamide resin, polyimide resin, unsaturated polyester resin, polyphenylene ether resin, polyphenylene sulfide resin, and benzocyclobutene (BCB).

The pixel electrode 710 of the OLED 70 may be formed on the planarization layer 180. The pixel electrode 710 may be connected to the drain electrode 177 through the contact hole 182 of the planarization layer 180.

In addition, a pixel defining layer 190 having an opening that exposes the pixel electrode 710 may be formed on the planarization layer 180. That is, the pixel electrode 710 may be disposed to correspond to the opening of the pixel defining layer 190.

The pixel defining layer 190 may be black or grey-based color. In addition, the pixel defining layer 190 may be made of a resin material, e.g., polyacrylate resin and polyimide resin, or a pigment included in the resin.

An organic emission layer 720 may be formed on the pixel electrode 710 within the opening of the pixel defining layer 190. A first common electrode 730 may be formed on the pixel defining layer 190 and the organic emission layer 720.

As described, the OLED 70 including the pixel electrode 710, the organic emission layer 720, and the first common electrode 730 may be formed. In addition, in the first exemplary embodiment of the present invention, the OLED 70 may further include the transmission layer 600 and the second common electrode 750.

The transmission layer 600 may be formed on the first common electrode 730. An organic layer or an inorganic layer may be used as the transmission layer 600. In the OLED display 100 according to the first exemplary embodiment, an organic layer is used as the transmission layer 600. In addition, the transmission layer 600 may have an average thickness within an appropriate range. In this case, the thickness of the transmission layer 600 is determined in accordance with a refractive index of the transmission layer 600.

The second common electrode 750 may be formed on the transmission layer 600. The first common electrode 730 and the second common electrode 750 may be transflective. The transflective layer used as the first common electrode 730 and the second common electrode 750 may be made of at least one of magnesium (Mg), silver (Ag), calcium (Ca), lithium (Li), chromium (Cr), and aluminum (Al).

In addition, the first common electrode 730 and the second common electrode 750 may have sufficient reflectivity to efficiently emit light generated from the OLED 70 and minimize reflection of external light. For example, the first common electrode 730 may have a reflectivity of less than 50% and the second common electrode 750 may have a reflectivity of less than 30%.

In addition, both sides of the transmission layer 600 may be respectively attached to the first common electrode 730 and the second common electrode 750. That is, an interface with air may not exist between the transmission layer 600 and the first common electrode 730 and between the transmission layer 600 and the second common electrode. In addition, the transmission layer 600 may have a sufficient thickness and refractive index to generate destructive interference between the first and second common electrodes 730 and 750 by reflection of light.

The thickness and the refractive index of the transmission layer 600 may be determined through the following equation, derived from destructive interference of reflected light.

$$d = \lambda/4nd \cos\theta \qquad \text{Equation 1}$$

Here, d denotes a distance between two reflection sides. That is, d denotes a distance between the first common electrode 730 and the second common electrode 750, and also denotes the thickness of the transmission layer 600. A refractive index of the transmission layer 600 is represented by n, θ denotes an incidence angle of light, and λ denotes a wavelength of reflected light.

A wavelength of visible light and a refractive index of a material used as the transmission layer 600 are applied to Equation 1. In addition, if an average incidence angle of external light is about 30 degrees to 45 degrees, a desired average thickness of the transmission layer 600 can be calculated. That is, according to a type of a material used as the transmission layer 600, the transmission layer 600 may be set to have an appropriate thickness. Alternatively, if the transmission layer 600 is to have a desired thickness, a material having an appropriate refractive index may be selected to form the transmission layer 600.

According to the above-described structure, external light transmitted to the first common electrode 750 through the second common electrode 750 may be partially reflected by the first common electrode 730 and transmitted toward the second common electrode 750. The light transmitted to the second common electrode 750 may partially pass through the second common electrode 750 and emitted, and remaining light may be is reflected again and transmitted to the first common electrode 730. As described, destructive interference may occur while the external light is iteratively reflected between the first and second common electrodes 730 and 750 with the transmission layer 600 therebetween, so that a significant amount of the external light may be extinguished. Therefore, the OLED display 100 may improve visibility by suppressing reflection of external light.

In addition, as described above, the first common electrode 730 and the second common electrode 750 may be transflective. However, the OLED display 100 according to embodiments are not limited thereto. Therefore, one of the first common electrode 730 and the second common electrode 750 may be transmissive. The pixel electrode 710 may be formed as one of a transmissive electrode, a transflective layer, and a reflective layer.

According to materials forming the pixel electrode 710, the first common electrode 730, and the second common electrode 750, the OLED display 100 can be classified as a top light emitting type, a bottom light emitting type, and a dual-side light emitting type. The OLED display 100 according to the first exemplary embodiment is a top light emitting type of OLED display. That is, the OLED 70 emits light toward the first common electrode 730 and the second common electrode 750 to display an image.

Transparent conductive materials may include indium tin oxide (ITO), indium zinc oxide (IZO), zinc oxide (ZnO), indium oxide (In2O3), and so forth. Reflective materials may include lithium (Li), calcium (Ca), fluorinated lithium/calcium (LiF/Ca), fluorinated lithium/aluminum (LiF/Al), aluminum (Al), silver (Ag), magnesium (Mg), gold (Au), and so forth.

The organic emission layer 720 may be made of a low-molecular organic material or a high-molecular organic material. The organic emission layer 720 may be formed in a multi-layer structure including at least one of a hole injection layer (HIL), a hole transport layer (HTL), an emission layer, an electron transport layer (ETL), and an electron injection layer (EIL). That is, the HIL may be disposed on the pixel electrode 710, which is a positive electrode, and the HTL, the emission layer, the ETL, and the EIL may be sequentially stacked thereon.

The sealing member 210 may be disposed on the OLED 70. The sealing member 210 may be disposed opposite to the substrate member 111 and may cover the thin film transistor 20 and the OLED 70.

The optical member 58 may be formed on the sealing member 210. The optical member 58 may include the CLC layer 585, the phase delay plate 583, and the polarizing plate 581 sequentially arranged on the sealing member 210. The optical member 58 may suppress reflection of external light to minimize loss of light emitted to outside from the organic emission layer 720 while improving visibility of the OLED display 100.

Hereinafter, referring to FIG. 3 and FIG. 4, a principle that allows the optical member 58 of the OLED display 100 according to the first exemplary embodiment to efficiently suppress reflection of external light and minimize loss of light emitted to the outside will be described in further detail.

Figure 3:
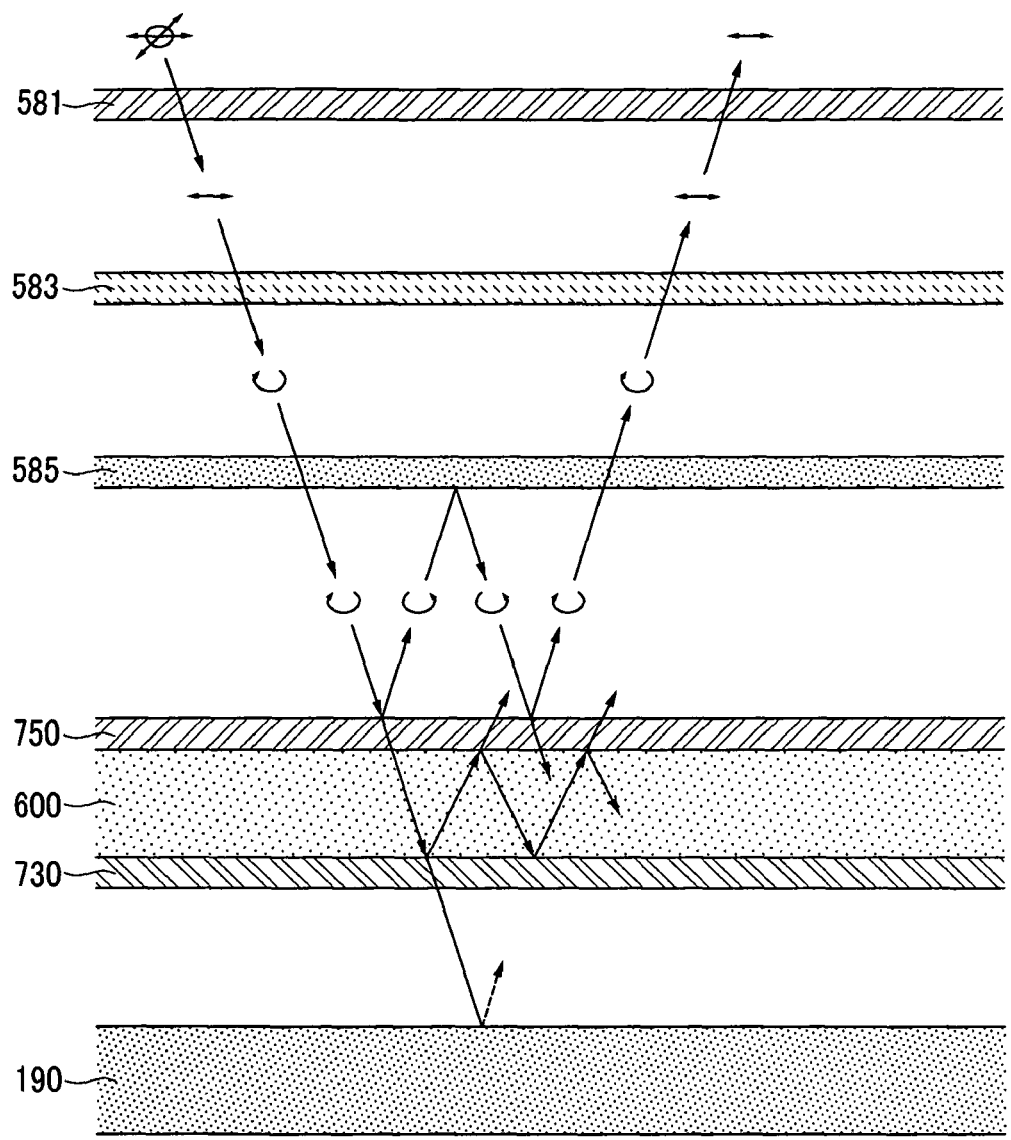
FIG. 3 illustrates a path of light transmitted into the OLED display of FIG. 1.

Referring to FIG. 3, a path of external light that passes through the optical member 58 will be described first.

External light is linearly polarized along the polarization axis of the polarizing plate 581 after passing through the polarizing plate 581. The linearly polarized light is circularly polarized after passing through the phase delay plate 583, i.e., a ¼ wavelength plate. In this case, the optic axis of the phase delay plate 583 is rotated by 45 degrees with respect to the polarization axis of the polarizing plate 581. That is, an angle of intersection between the optic axis of the phase delay plate 583 and the polarization axis of the second polarizing plate 581 is 45 degrees.

As described, since the angle of intersection between the linearly polarized light and the optics axis of the phase delay plate 583 is 45 degrees, the linearly polarized light becomes circularly polarized light after passing through the phase delay plate 583. In this particular example, the circularly polarized light is right circularly polarized light. However, embodiments are not limited thereto. Therefore, the light output from the phase delay plate 583 may be left circularly polarized according to a layout of the phase delay plate 583.

The right circularly polarized light passes through the CLC layer 585, which transmits right circularly polarized light and reflects left circularly polarized light. However, embodiments are not limited thereto. Therefore, the CLC layer 585 may transmit left circularly polarized light and reflect right circularly polarized light. However, in this case, light from the phase delay plate 583 should be left circularly polarized light. That is, the CLC layer 585 should transmit light that is circularly polarized after having passed through the polarizing plate 581 and the phase delay plate 583.

The right circularly polarized light having passed through the CLC layer 585 may be reflected between the second common electrode 750 and the first common electrode 730 so that a significant amount thereof may be extinguished due to destructive interference. In addition, right circularly polarized light not extinguished may be reflected by at least one of the second common electrode 750, the first common electrode 730, and the pixel electrode 710, and transmitted back to the CLC layer 585. In this case, upon reflection, the right circularly polarized light changes to left circularly polarized light. This left circularly polarized light cannot pass through the CLC layer 585 and is thus reflected back to the second common electrode 750, where it is reflected between the second and first common electrodes 750 and 730 so that a significant amount thereof is again extinguished due to destructive interference.

Upon reflection by at least one of the second common electrode 750, the first common electrode 730, and the pixel electrode 710, the left circularly polarized is changed back to right circularly polarized light. The right circularly polarized light having passed through the CLC layer 585 is linearly polarized after passing through the phase delay plate 583. In this case, a light axis direction of the linearly polarized light is substantially the same as the polarization axis of the polarizing plate 581. Here, the light axis direction of the linearly polarized light and the polarization axis of the polarizing plate are slightly different from each other for each wavelength band, i.e., they cannot be exactly the same. On average, visible light will have a direction that is substantially the same as the direction of the polarization axis of the polarizing plate 581. Therefore, the linearly polarized light may pass through the polarizing plate 581 and emitted outside.

As described, external light is reflected between the second common electrode 750 and the first common electrode 730 several times after passing through the optical member 58 and may be significantly extinguished due to destructive interference. Accordingly, the OLED display 100 may efficiently suppress reflection of external light.

In addition, as shown in FIG. 2, the black or grey-based colored pixel defining layer 190 may absorb light to further suppress reflection of external light.

Figure 4:
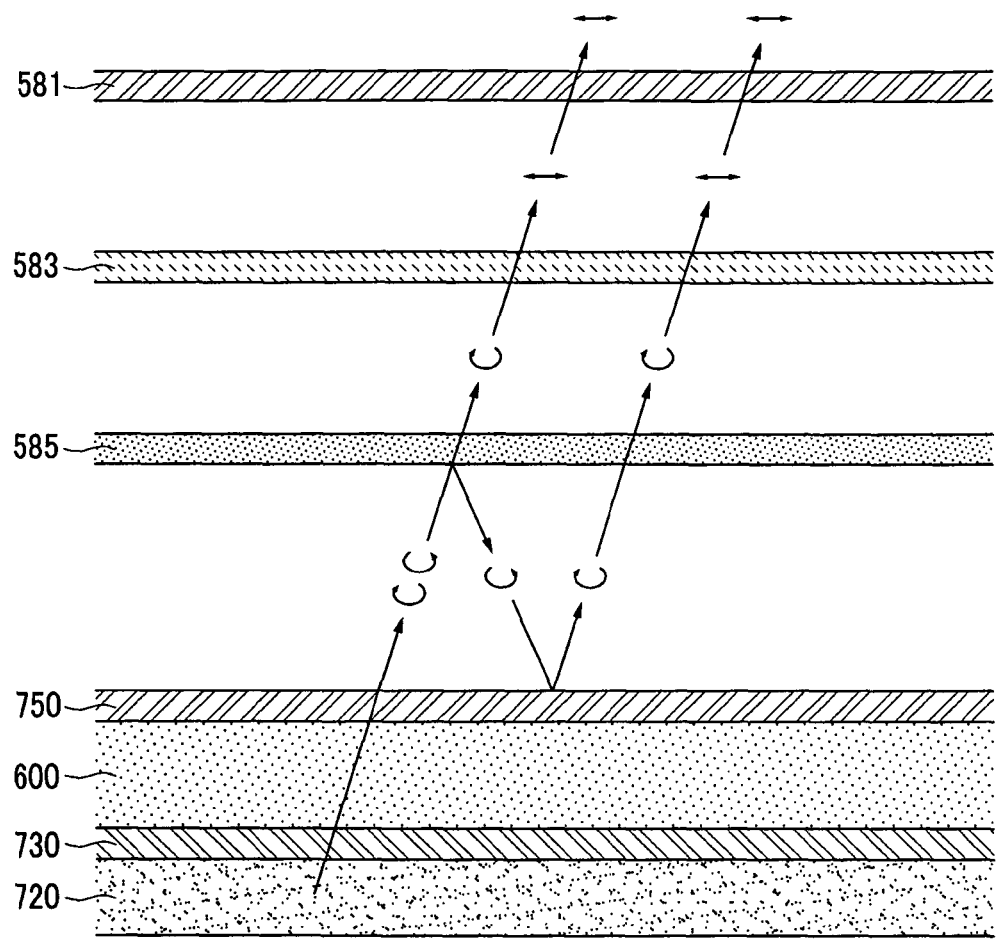
FIG. 4 illustrates a path for emission of light generated from an OLED of the OLED display FIG. 1 to the outside.

Referring to FIG. 4, a path of light output from the organic emission layer 720 to the outside will now be described.

Light emitted from the organic emission layer 720 sequentially passes through the first common electrode 730, the transmission layer 600, and the second common electrode 750, and is transmitted to the CLC layer 585. Light output from the organic emission layer 720 has various phases. Right circularly polarized light having passed through the second common electrode 750 passes through the CLC layer 585 and is transmitted to the phase delay plate 583. Left circularly polarized light is reflected and transmitted to the second common electrode 750. Light having passed through the CLC layer 585 is linearly polarized after passing through the phase delay plate 583. The linearly polarized light is passed through the polarizing plate 581 and emitted outside. The light transmitted to the second common electrode 750 is changed to circularly polarized light after being reflected by the second common electrode 750, the first common electrode 730, or the pixel electrode. In addition, light may be reflected not only by the electrodes 710, 730, and 750 of the OLED 70, but also by other metal wires. The right circularly polarized light may sequentially pass through the CLC layer 585, the phase delay plate 583, and the polarizing plate 581 and emitted outside.

As described, in the case of the OLED display 100 according to the first exemplary embodiment, the amount of external light that is reflected and emitted outside may be relatively much less than the amount of light generated from the OLED 70 and emitted outside. Therefore, the OLED display 100 may minimize loss of light emitted outside from the organic emission layer 720 while effectively suppressing reflection of external light.

Hereinafter, a second exemplary embodiment will be described with reference to FIG. 5.

Figure 5:
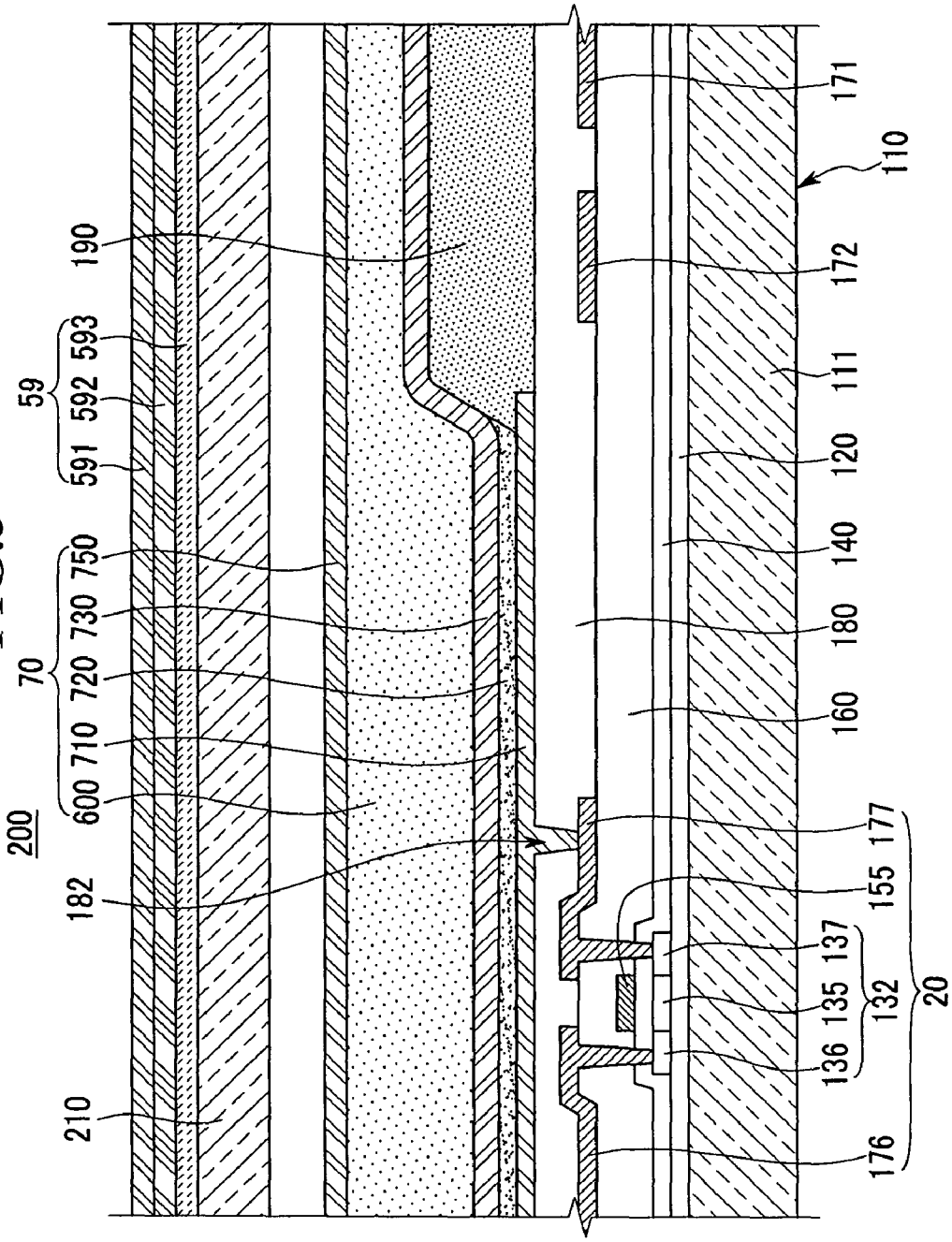
FIG. 5 illustrates a cross-sectional view of an OLED display according to a second exemplary embodiment.

As shown in FIG. 5, an optical member 59 of an OLED display 200 according to the second exemplary embodiment may include a polarizing plate 591, a selective reflective layer 592, and a phase delay plate 593. That is, the optical member 59 may include the phase delay plate 593, the selective reflective layer 592, and the polarizing plate 591 sequentially arranged on a sealing member 210.

A dual brightness enhancement film (DBEF) may be used as the selective reflective layer 592. Hereinafter, the selective reflective layer 592 will be referred to as the DBEF in the second exemplary embodiment.

The DBEF 592 may transmit light that matches a polarization axis thereof and may reflect light that does not match the polarization axis. That is, the polarizing plate 591 is different from the DBEF 592 in that the polarizing plate 591 absorbs light that does not match the polarization axis.

The polarization axis of the polarizing plate 591 may be the same as that of the DBEF 592. In addition, an angle of intersection between a light axis of the phase delay plate 593 and the polarization axis may be 45 degrees.

Further, the pixel defining layer 190 may have a black or grey-based color. Thus, the pixel defining layer 190 may suppress reflection of external light by absorbing light. The pixel defining layer 190 has the black or grey-based color in the second exemplary embodiment of the present invention, but it is not limited thereto. That is, the pixel defining layer 190 may not be colored.

With the above-described configuration, the OLED display 200 may minimize loss of light emitted outside from an organic emission layer 720 while improving visibility by effectively suppressing reflection of external light.

Hereinafter, referring to FIG. 6 and FIG. 7, a principle that allows the optical member 59 of the OLED display 200 according to the second exemplary embodiment to efficiently suppress reflection of external light and minimize loss of light emitted to the outside will be described in further detail.

Figure 6:
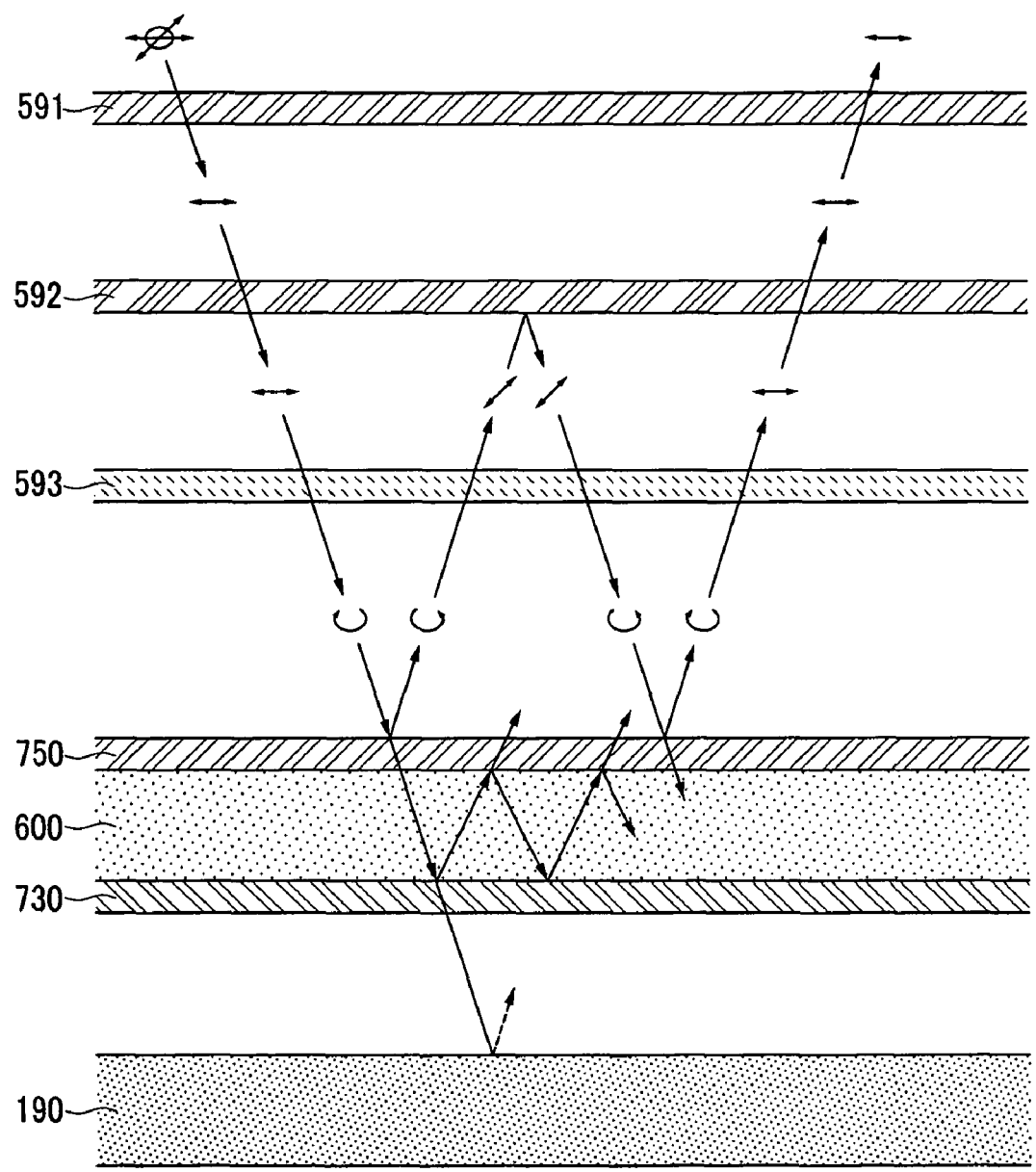
FIG. 6 illustrates a cross-sectional view of a path for transmission of light from outside into the OLED display of FIG. 5.

Referring to FIG. 6, a path of external light that passes through the optical member 59 will be described first.

External light is linearly polarized toward the polarization axis of the polarizing plate 591 while passing through the polarizing plate 591. The linearly polarized light passes through the DBEF 592 without substantial loss and is transmitted to the phase delay plate 593. The linearly polarized light is circularly polarized after passing through the phase delay plate 593, which is a ¼ wavelength plate. In this case, the light axis of the phase delay plate 593 is rotated by 45 degrees with respect to the polarization axis of the DBEF 592. That is, an angle of intersection between the light axis of the phase delay plate 593 and the polarization axis of the DBEF 592 is 45 degrees.

As described, since the angle of intersection between the linearly polarized light and the optic axis of the phase delay plate 593 is 45 degrees, the linearly polarized light is changed to circularly polarized light after passing through the phase delay plate 593. In this case, the circularly polarized light is right circularly polarized light. However, the second exemplary embodiment according to the present invention is not limited thereto. Therefore, the light having passed through the phase delay plate 593 may be left circularly polarized light.

The right circularly polarized light having passed through the phase delay plate 593 may be reflected between a second common electrode 750 and a first common electrode 730 so that a significant amount thereof may be extinguished due to destructive interference. In addition, a part of the right circularly polarized light may be reflected by the second common electrode 750, the first common electrode 730, or the pixel electrode 710 and transmitted back to the phase delay plate 593. In this case, the right circularly polarized light is changed to left circularly polarized light after being reflected. In addition, the left circularly polarized light is linearly polarized while being passed through the phase delay plate 593. Now, an axis direction of the linearly polarized light is orthogonal to the polarizing axis of the DBEF 592. Therefore, the light that cannot pass through the DBEF 592 is reflected and passed through the phase delay plate 593, and then transmitted to the second common electrode 750. In addition, the linearly polarized light becomes left circularly polarized light after being passed through the phase delay plate 593. The left circularly polarized light may then be reflected between the second common electrode 750 and the first common electrode 730 so that a significant amount of the light may be extinguished due to the destructive interference.

Left circularly polarized reflected by the second common electrode 750, the first common electrode 730, or the pixel electrode 710 is changed back to right circularly polarized light. The right circularly polarized light is linearly polarized after passing through the phase delay plate 593. In this case, a light axis direction of the linearly polarized light is substantially the same as the polarization axis of the DBEF 592. Here, the light axis direction of the linearly polarized light and the polarizing axis of the DBEF 591 are slightly different from each other for each wavelength band, so that they cannot be exactly the same. On average, visible light may have a light axis that is substantially the same as the direction of the polarizing axis of the DBEF 592. Therefore, the linearly polarized light may be substantially passed through the DBEF 592 and the polarizing plate 591 and emitted outside.

As described, external light may be reflected between the second common electrode 750 and the first common electrode 730 several times after having passed through the optical member 59 and may be significantly extinguished due to destructive interference. Accordingly the OLED display 200 may efficiently suppress reflection of external light. In addition, as shown in FIG. 5, the black or grey-based colored pixel defining layer 190 may absorb light for efficient suppression of external light.

Figure 7:
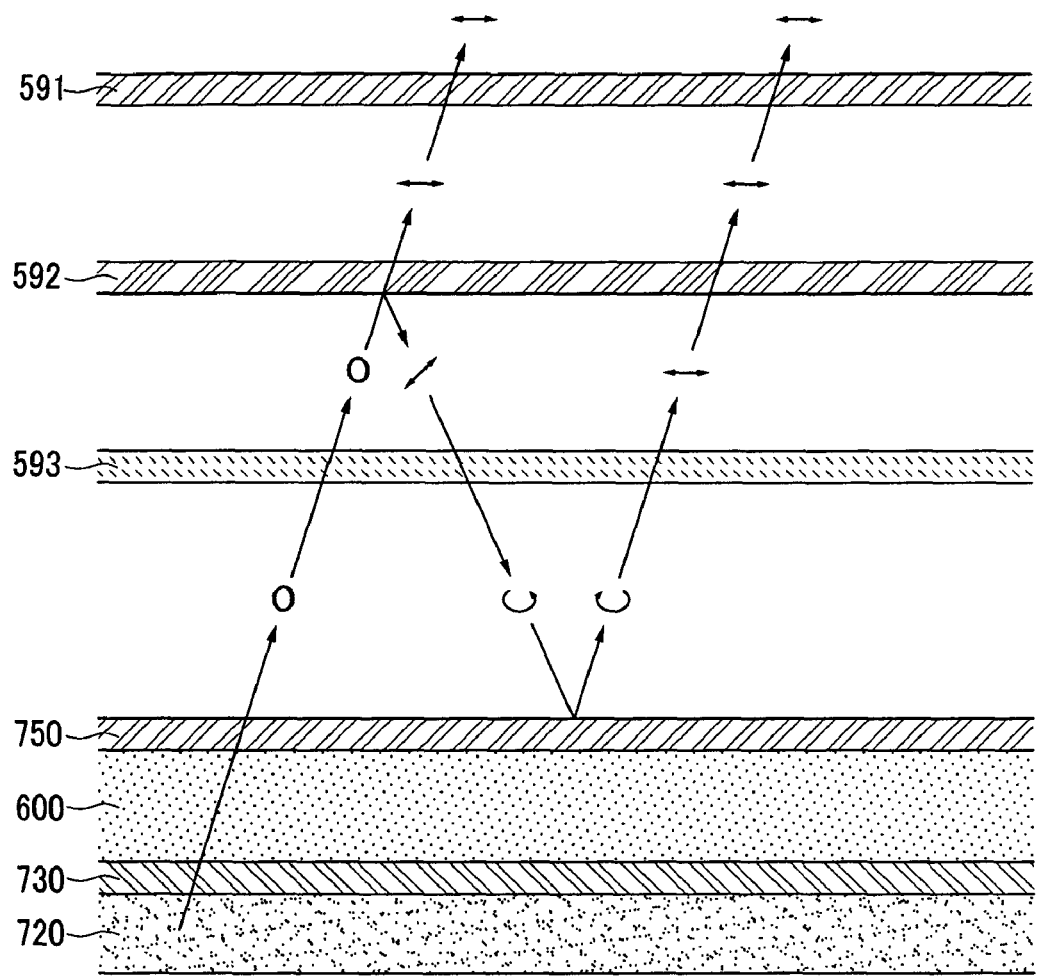
FIG. 7 illustrates a cross-sectional view and a configuration diagram of a path for emission of light generated from an OLED of the OLED display of FIG. 5.

Referring to FIG. 7, a path of light emitted outside from the organic emission layer 720 will now be described.

Light emitted from the organic emission layer 720 sequentially passes through the first common electrode 730, a transmission layer 600, the second common electrode 750, and transmitted to the DBEF 592 through the phase delay plate 593. In this case, the light has various phases.

Among the light having passed through the phase delay plate 593, light having a component that is the same as the polarization axis of the DBEF 592 is passed through the DBEF 592, while and the remaining light is reflected and then transmitted to the phase delay plate 593. Here, the light passed through the DBEF 592 is linearly polarized. The linearly polarized light is passed through the polarizing plate 591 without any substantial loss and then emitted outside. The light reflected from the DBEF 592 is passed through the phase delay plate 593 and transmitted to the second common electrode 750. In this case, a significant amount of the light may be left circularly polarized while passing through the phase delay plate 593. In addition, the left circularly polarized light transmitted to the second common electrode 750 becomes right circularly polarized light while being reflected to the second common electrode 750, the first common electrode 730, or the pixel electrode 710. In addition, light may be reflected not only by the electrodes 710, 730, and 750 of the OLED 70, but also by other metal wires. The right circularly polarized light may sequentially pass through the phase delay plate 583, the DBEF 592, and the polarizing plate 591, to be emitted outside.

As described, in the case of the OLED display 200 according to the second exemplary embodiment, the amount of external light that is reflected and emitted outside is relatively much less than the amount of light generated from the OLED 70 and emitted outside. Therefore, the OLED display 200 may minimize loss of light emitted outside from the organic emission layer 720 while effectively suppressing reflection of external light.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display comprising:
   a pixel electrode on a substrate;
   an organic emission layer on the pixel electrode;
   a first common electrode on the organic emission layer;
   a transmission layer on the first common electrode;
   a second common electrode on the transmission layer;
   a selective reflective layer on the second common electrode;
   a polarizing plate on the selective reflective layer; and
   a phase delay plate between the polarizing plate and the second common electrode.

2. The OLED display as claimed in claim 1, wherein the selective reflective layer is a cholesteric liquid crystal (CLC) layer, and the phase delay plate is between the polarizing plate and the CLC layer.

3. The OLED display as claimed in claim 2, wherein the CLC layer transmits one of left circularly polarized light and right circularly polarized light and reflects the other.

4. The OLED display as claimed in claim 3, wherein light that is linearly polarized after passing through the polarizing plate is circularly polarized after passing through the phase delay plate.

5. The OLED display as claimed in claim 4, wherein the phase delay plate is a ¼ wavelength plate, and an angle of intersection between an optic axis of the phase delay plate and a polarization axis of the polarizing plate is 45 degrees.

6. The OLED display as claimed in claim 1, wherein the selective reflective layer is a dual brightness enhancement film (DBEF) and the phase delay plate is between the second common electrode and the DBEF.

7. The OLED display as claimed in claim 6, wherein the polarizing plate and the DBEF have the same polarization axis.

8. The OLED display as claimed in claim 7, wherein light that is linearly polarized after passing through the DBEF is circularly polarized after passing through the phase delay plate.

9. The OLED display as claimed in claim 8, wherein the phase delay plate is a ¼ wavelength plate, and an angle of intersection between an optic axis of the phase delay plate and a polarization axis of the polarizing plate is 45 degrees.

10. The OLED display as claimed in claim 1, wherein one of the first common electrode and the second common electrode is formed as a transflective layer.

11. The OLED display as claimed in claim 10, wherein the transflective layer includes at least one of magnesium (Mg), silver (Ag), calcium (Ca), lithium (Li), chromium (Cr), and aluminum (Al).

12. The OLED display as claimed in claim 1, further comprising a pixel defining layer having an opening that exposes the pixel electrode and is formed on the substrate member.

13. The OLED display as claimed in claim 12, wherein the pixel defining layer has a black or grey-based color.

14. The OLED display as claimed in claim 12, wherein the pixel defining layer is disposed under the first common electrode.

15. The OLED display as claimed in claim 1, wherein the phase delay plate is between the polarizing plate and the selective reflective layer.

16. The OLED display as claimed in claim 1, wherein the phase delay plate is between the second common electrode and the selective reflective layer.

17. The OLED display as claimed in claim 1, wherein the transmission layer is directly on the first common electrode and the second common electrode is directly on the transmission layer.

18. An optical member for use with an organic light emitting diode (OLED) display including a pixel electrode on a substrate, an organic emission layer on the pixel electrode, a first common electrode on the organic emission layer, a transmission layer on the first common electrode, a second common electrode on the transmission layer, the optical member comprising:

a selective reflective layer to be positioned adjacent the second common electrode;
a polarizing plate on the selective reflective layer; and
a phase delay plate between the polarizing plate and the second common electrode.

19. The optical member as recited in claim 18, wherein the OLED display includes a sealing member, the optical member being on the sealing member.

20. The optical member as recited in claim 18, wherein the OLED display includes a sealing member, the optical member being between the sealing member and the second common electrode.

\* \* \* \* \*